(12) United States Patent
Usui et al.

(10) Patent No.: US 7,507,658 B2
(45) Date of Patent: Mar. 24, 2009

(54) SEMICONDUCTOR APPARATUS AND METHOD OF FABRICATING THE APPARATUS

(75) Inventors: Ryosuke Usui, Ichinomiya (JP); Yasunori Inoue, Ogaki (JP); Hideki Mizuhara, Bisai (JP)

(73) Assignee: Sanyo Electric Co., Ltd., Osaka (JP)

( * ) Notice: Subject to any disclaimer, the term of this patent is extended or adjusted under 35 U.S.C. 154(b) by 209 days.

(21) Appl. No.: 11/086,635

(22) Filed: Mar. 22, 2005

(65) Prior Publication Data

US 2005/0212091 A1  Sep. 29, 2005

(30) Foreign Application Priority Data

Mar. 29, 2004 (JP) .............................. 2004-096745

(51) Int. Cl.
*H01L 21/4763* (2006.01)
(52) U.S. Cl. ..................... 438/637; 438/638; 438/640; 257/774; 174/262

(58) Field of Classification Search ................. 438/637, 438/638, 662, 640; 257/774; 174/262
See application file for complete search history.

(56) References Cited

U.S. PATENT DOCUMENTS

| 5,576,630 | A  | * | 11/1996 | Fujita .......................... 324/760 |
| 6,201,271 | B1 | * | 3/2001 | Okutoh et al. ............... 257/295 |
| 6,674,017 | B1 | * | 1/2004 | Yamasaki et al. ........... 174/262 |
| 2005/0073049 | A1 | * | 4/2005 | Tsubosaki ................... 257/738 |

FOREIGN PATENT DOCUMENTS

JP  2002-110717  4/2002
JP  2003-249498  9/2003

* cited by examiner

*Primary Examiner*—Zandra Smith
*Assistant Examiner*—Sonya D McCall Shepard
(74) *Attorney, Agent, or Firm*—Fish & Richardson P.C.

(57) ABSTRACT

A via hole is formed by a first step of forming an opening in a resin insulating film by laser radiation, a second step of forming an opening in said resin insulating film by dry etching and a third step of performing reverse sputtering in a plasma environment.

9 Claims, 3 Drawing Sheets

SEMICONDUCTOR APPARATUS AND METHOD OF FABRICATING THE APPARATUS

BACKGROUND OF THE INVENTION

1. Field of the Invention

The present invention relates to a semiconductor apparatus in which vias are formed and a method of fabricating the same.

2. Description of the Related Art

With portable electronic appliances such as mobile phones, PDAs, DVCs and DSCs becoming more and more advanced in their capabilities, miniaturization and weight reduction of products have become essential for market acceptance. Accordingly, highly-integrated system LSIs for achieving these goals are demanded. Also, better ease and convenience of use are required of these electronic appliances. In this respect, high capabilities and high performance are required of LSIs used in these appliances. While the number of I/Os is increasing as a result of increasingly high integration of LSI chips, there is also a persistent requirement for miniaturization of packages themselves. In order to meet these incompatible demands, development of a semiconductor package adapted for high-density substrate mounting of semiconductor components is in serious demand. A packaging technology called chip size packaging (CSP) has been developed in a variety of forms to address these requirements. For example, the patent document No. 1 discloses a CSP technology.

In a semiconductor package fabricated using the CSP technology, a signal from a semiconductor chip is brought out via an electrode pad. Therefore, vias are formed on the electrode pad. Since the semiconductor chip is formed under the electrode pad, it is necessary to form a via without applying high heat.

It is to be noted that copper has come to be used as a material for electric connection in association with an increasingly high speed of the operation of electronic appliances. A problem with copper is that, when heat is applied to a pad electrode formed by copper, the surface of the pad electrode is oxidized. The patent document No. 1 describes an embodiment in which the top of the pad electrode is capped by an antioxidant Al pad electrode to address the above-mentioned problem.

Related document
1. JP 2003-249498 A
2. JP 2002-110717 A

SUMMARY OF THE INVENTION

The present invention has been done in view of the aforementioned circumstances and its object is to provide a technology to improve the stability of a semiconductor apparatus provided with vias connected to electrode pads of circuit elements.

The method of fabricating a semiconductor apparatus according to the present invention comprises: forming a via hole in a resin insulating film formed on a circuit element provided with electrode pads so as to expose the electrode pads; and introducing a conductive material in the via hole for connection with the electrode pads, wherein the forming of the via hole includes a first step of forming an opening in the resin insulating film by laser radiation, and a second step of forming an opening in the resin insulating film by dry etching. The phrase "circuit elements" refers to semiconductor elements and passive elements.

According to this method, after an opening is efficiently formed by laser radiation, an opening is finely formed by dry etching. With this, fine processing is achieved as well as reducing a period of time required to form a via hole. In forming a via hole that exposes a circuit element, creation of an opening only by laser radiation may result in the circuit element being damaged due to laser heat. More specifically, Cu or Al contained in the circuit element may be melted or device properties may be degraded due to heat applied to a transistor section. According to the method of the present invention, an opening is formed in steps. An opening to a depth not causing damage to the circuit element is formed by laser, and then an opening is further formed by dry etching.

The semiconductor apparatus may further include a conductive film formed on the resin insulating film, and the forming of the via hole may include a step of removing a portion of the conductive film and performing the first step and the second step using the conductive film as a mask. With this, the via hole is formed easily.

The first step may include a step of forming an opening in the resin insulating film by a first laser and a step of forming an opening in the resin insulating film by a second laser characterized by a speed in processing the resin insulating film slower than that of the first laser. With this, an opening is efficiently formed initially by a laser characterized by a high processing speed and then finely processed by a laser characterized by a slow processing speed.

The first step may include a step of forming an opening in the resin insulating film by a $CO_2$ gas laser and a step of forming an opening in the resin insulating film by a YAG laser. With this, the step for laser radiation for forming an opening may be such that an opening is efficiently formed initially by a $CO_2$ gas laser and then an opening is finely formed by a YAG laser.

The forming of the via hole may include a third step of performing reverse sputtering in a plasma environment. With this, an oxide film created on the surface of the electrode pad as a result of laser radiation or dry etching can be removed so that low resistance of the via hole and the electrode pad is achieved. Additionally, adhesion between the via hole and the electrode pad is improved.

A semiconductor apparatus according to the present invention comprises: circuit elements each provided with electrode pads; a resin insulating film formed on the circuit elements; and vias provided in the resin insulating film and connected to the electrode pads, wherein each of the vias is formed such that a portion of a side wall thereof is surrounded by a corresponding one of the electrode pads. With this structure, the area of contact between the via and the electrode pad is increased and low resistance of the via hole and the electrode pad is achieved.

Described above is an explanation of the structures of the present invention. Arbitrary combinations of the structures may also be practiced as additionally modes of the present invention. Implementations of the invention in the form of other categories may also be practiced as additional modes of the present invention.

DETAILED DESCRIPTION OF THE INVENTION

Figure 1A:
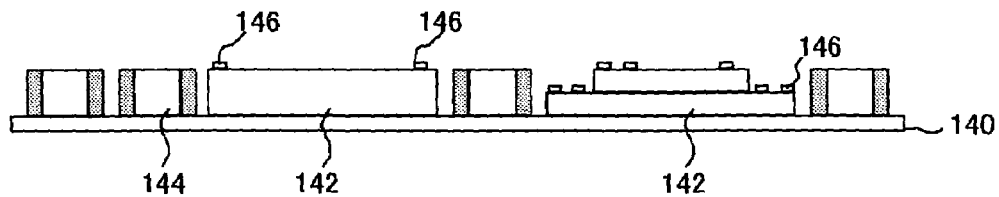
FIGS. 1A-1F illustrate a procedure for fabricating a semiconductor apparatus according to an embodiment of the present invention.

FIGS. 1A-1F illustrate a procedure for fabricating a semiconductor apparatus according to an embodiment of the present invention. As illustrated in FIG. 1A, a plurality of semiconductor elements 142 and a plurality of passive elements 144 are first placed on a substrate 140. The semiconductor elements 142 are generic to, for example, transistors, diodes, IC chips and the like. The passive elements 144 are generic to chip capacitors, chip resistors and the like. Electrode pads 146 are provided on the surface of the semiconductor element 142. FIGS. 1A-1F illustrate the electrode pads 146 as projections provided on the semiconductor element 142. The structure of the semiconductor element 142 is not limited to the illustrated structure. For example, the electrode pads 146 may be embedded in recesses provided in the semiconductor element 142. The semiconductor element 142 may be a stack of a plurality of semiconductor elements 142. For example, the stack may include a combination of an SRAM and a flash memory or a combination of an SRAM and a DRAM.

Figure 1B:
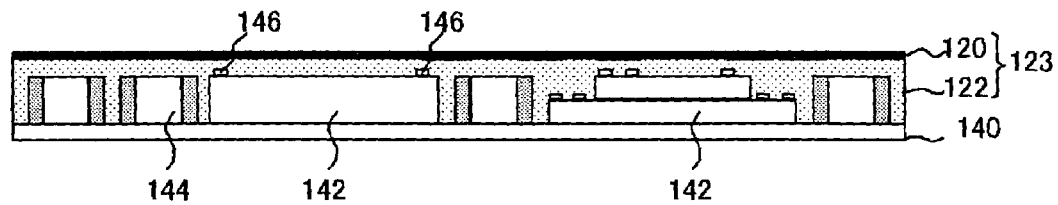

A composite of conductive film and resin insulating film 123 comprising a conductive film 120 and a resin insulating film 122 is placed on the plurality of semiconductor elements 142 and the plurality of passive elements 144. The composite of conductive film and resin insulating film 123 is thrust against the substrate 140 so that the semiconductor elements 142 and the passive elements 144 are introduced into the resin insulating film 122. Subsequently, the resin insulating film 122 is heated in a vacuum or under a reduced pressure so that the film is bonded to the substrate 140. As illustrated in FIG. 1B, this results in the semiconductor elements 142 and the passive elements 144 being embedded in the resin insulating film 122 and the semiconductor elements 142 and the passive elements 144 being bonded inside the resin insulating film 122.

The conductive film 120 may be a rolled metal such as a rolled copper foil. Any material may be used to form the resin insulating film 122 as long as it is softened by heating. For example, melamine derivatives such as epoxy resin and BT resin, liquid crystal polymer, PPE resin, polyimide resin, fluororesin, phenol resin, polyamide bismaleimide maybe used. By using a material as listed, the rigidity of a semiconductor module is increased and the stability of a semiconductor module is improved. By using a thermosetting resin such as epoxy resin, BT resin, PPE resin, polyimide resin, fluororesin, phenol resin, polyamide bismaleimide to form the resin insulating film 122, the rigidity of a semiconductor module is improved.

Epoxy resin may be bisphenol A type resin, bisphenol F type resin, bisphenol S type resin, phenol novolac resin, creosol novolak type epoxy resin, tris-phenol methane type epoxy resin, alicycle epoxy resin, and the like.

Melamine derivative may be melamine, melamine cyanurate, methylol melamine, (iso) cyanuric acid, melam, melem, succino guamine, melamine sulfate, acetoguanamine sulfate, melam sulfate, guanyl melamine sulfate, melamine resin, BT resin, cyanuric acid, iso-cyanuric acid, iso-cyanuric acid derivatives, melamine isocyanurate, benzoguanamine, acetoguanamine, or guanidine compounds.

Aromatic system liquid crystalline polyester, polyimide, polyesteramide and resin composites containing these are examples of liquid crystal polymer. Liquid crystalline polyester or liquid crystalline polyester composite, characterized by excellent balance in heat resistance, workability and moisture absorption, is preferable.

Liquid crystalline polyester may be (1) a product of reaction between aromatic dicarboxylic acid, aromatic diol and aromatic hydroxy carboxylic acid, (2) a product of reaction between a combination of aromatic hydroxy carboxylic acids, (3) a product of reaction between aromatic dicarboxylic acid and aromatic diol, (4) a product of reaction between polyester such as polyethylene terephthalate and aromatic hydroxy carboxylic acid, or the like. In place of aromatic dicarboxylic acid, aromatic diol and aromatic hydroxy carboxylic acid, ester derivatives of these may be used. Aromatic dicarboxylic acid, aromatic diol and aromatic hydroxy carboxylic acid may have their aromatic part replaced by halogen atoms, alkyl groups or aryl groups.

Examples of a repeated structural unit of liquid crystalline polyester are a repeated structural unit derived from aromatic dicarboxylic acid (formula (i) below), a repeated structural unit derived from aromatic diol (formula (ii) below), and a repeated structural unit derived from aromatic hydroxy carboxylic acid (formula (iii) below).

(i) —CO-$A_1$-CO— (where $A_1$ indicates a divalent ligand containing an aromatic ring)
(ii) —O-$A_2$-O— (wherein $A_2$ indicates a divalent ligand containing an aromatic ring)
(iii) —CO-$A_3$-O— (wherein $A_3$ indicates a divalent ligand containing an aromatic ring)

The resin insulating film 122 may include a filler or an additive such as fiber. Fibrous or granular $SiO_2$ or SiN may be used as the filler. By including a filler or fiber in the resin insulating film 122, it is possible to reduce warp of the resin insulating film 122, occurring when the resin insulating film 122 is cooled to, for example, a room temperature, after the resin insulating film 122 is heated and the semiconductor elements 142 and the passive elements 144 are thermo-compression bonded thereto. With this, adhesion between a) the semiconductor elements 142 and the passive elements 144 and b) the resin insulating film 122 is improved. By including fiber in the resin insulating film 122, the fluidity of the resin insulating film 122 is improved so that adhesion between a) the resin insulating film 122 and b) the semiconductor elements 142 and the passive elements 144 is improved. In this respect, aramid nonwoven fabric is preferably used as a material to form the resin insulating film 122. With this, workability is improved.

Para-aramid fiber or meta-aramid fiber may be used as aramid fiber. For example, poly (p-phenylene terephthalamide) (PPD-T) may be used to form the para-aramid fiber, and poly (m-phenylene isophthalamide) (MPD-I) may be used as meta-aramid.

The composite of conductive film and resin insulating film 123 may be formed by attaching the conductive film 120 on the resin insulating film 122. The composite of conductive film and resin insulating film 123 may also be formed by applying a resin composition constituting the resin insulating film 122 on the conductive film 120 and then drying the composition. In the embodiment, the resin composition may include a cure agent, an accelerator or other components without departing from the scope of the present invention. The composite of conductive film and resin insulating film 123 is placed on the substrate 140 in a state in which the resin insulating film 122 is rendered B-stage. With this, adhesion between a) the resin insulating film 122 and b) the semiconductor elements 142 and the passive elements 144 is improved. Subsequently, the resin insulating film 122 is heated in accordance with the type of resin constituting the resin insulating film 122. The composite of conductive film and resin insulating film 123 is bonded with the semiconductor elements 142 and the passive elements 144 in a vacuum or under a reduced pressure. An alternative approach to form the composite of conductive film and resin insulating film 123 is that, in the process of placing the B-stage resin insulating film 122 on the substrate 140, placing the conductive film 120 on top of the resin insulating film 122 and then thermo-compression bonding the resin insulating film 122 to the semiconductor elements 142 and the passive elements 144, the conductive film 120 may be thermo-compression bonded to the resin insulating film 122.

Figure 1C:
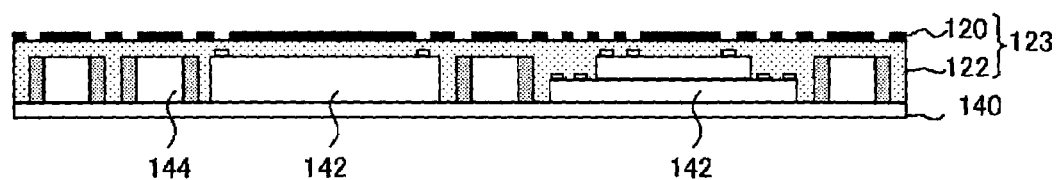
Figure 1D:
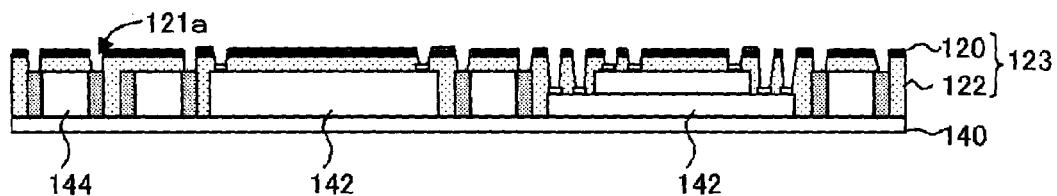

Subsequently, vias 121 are formed on the resin insulating film 122. The vias 121 are formed as described below. Selected areas of the conductive film 120 corresponding to locations for the vias are removed by a laser direct write process (trepanning alignment) or by wet etching of copper (FIG. 1C). Subsequently, via holes 121a are formed in the resin insulating film 122 using a combination of $CO_2$ gas laser, YAG laser, dry etching and reverse sputtering (FIG. 1D). Details of the above process will be given later.

Figure 1E:
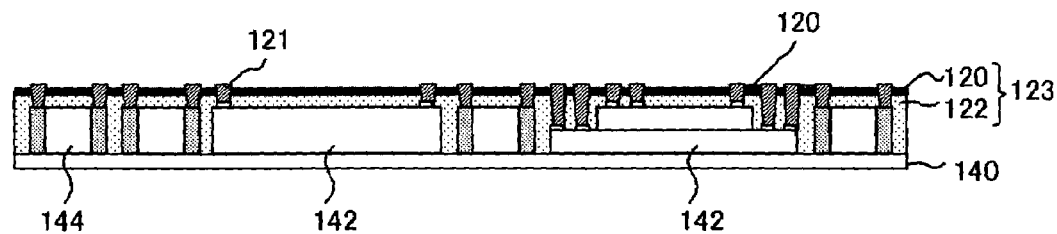

Subsequently, the interior of the via holes 121a is roughened and cleaned by a wet process. Electroless plating capable of high aspect ratio fill is conducted, followed by electroplating. Thereby, the interior of each of the via holes 121a is filled by a conductive material so as to form the vias 121 (FIG. 1E). For example, the vias 121 may be formed as described below. After forming a thin film of a thickness of about 0.5-1 μm on the entirety of the via holes 121a using electroless copper plating, a film of about 20 μm is formed by electroplating. Normally, palladium is used as a catalyst for electroless plating. In order to attach a catalyst for electroless plating to a flexible insulator substrate, palladium is contained in a water solution in the form of complex, the flexible insulating substrate is steeped in the solution so as to attach the palladium complex on the surface thereof, and the palladium complex is reduced to palladium as a metal, using a reducing agent. In this way, a core for plating is formed on the surface of the flexible insulating substrate.

Figure 1F:
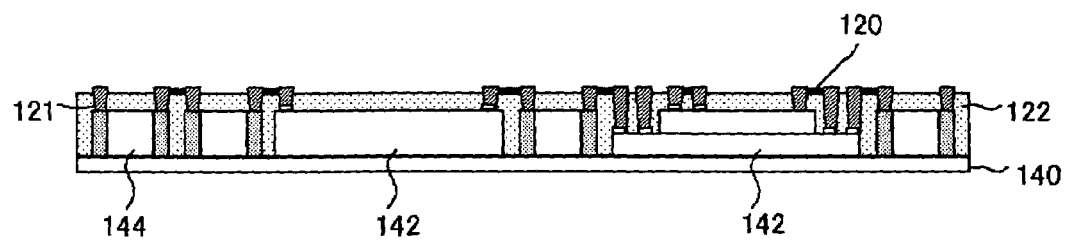

Subsequently, the wiring is formed by patterning (FIG. 1F). For example, the wiring is formed by spraying a chemical etchant on unnecessary portions of the conductive film where the film is free of the resist and is exposed, and by removing the portions sprayed with the etchant by etching, using a photoresist as a mask in etching. With this, a semiconductor apparatus 100 is formed. Subsequently, by building a stack of composite of conductive film and resin insulating films 123 and repeating similar processes, a multilayer wiring structure is obtained.

Figure 2A:
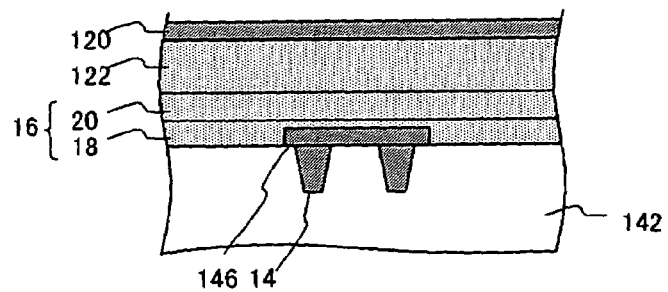
FIGS. 2A-2E are detailed illustrations of a process to form a via-hole illustrated in FIG. 1D.

FIGS. 2A-2E are detailed illustrations of a process to form the via hole 121a illustrated in FIG. 1D. As illustrated in FIG. 2A, a plug 14 is provided in the semiconductor element 142 and an electrode pad 146 is provided on the plug 14. A passivation layer 16 comprising an SiN film 18 and a polyimide film 20 is provided on the electrode pad 146. The resin insulating film 122 and the conductive film 120 are placed on the passivation layer 16.

Figure 2B:
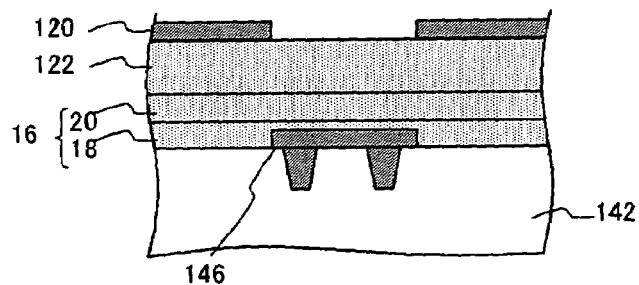

In this state, an etching resist (not shown) is formed on the conductive film 120. The etching resist is exposed and developed so as to open at a location of the via hole. Subsequently, the conductive film 120 not masked by the etching resist thus formed is removed by wet etching using a ferric-chloride solution (FIG. 2B). Subsequently, a water solution of alkali such as caustic soda is used to remove the ecthing resist.

Figure 2C:
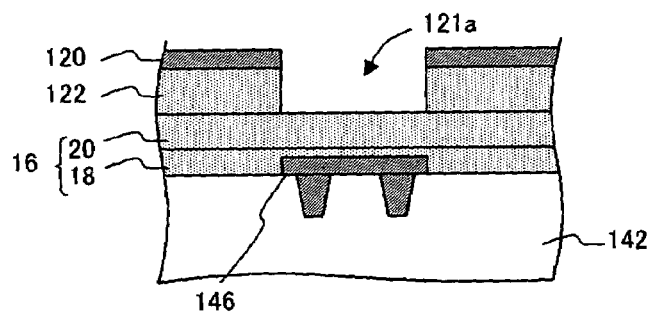
Figure 2D:
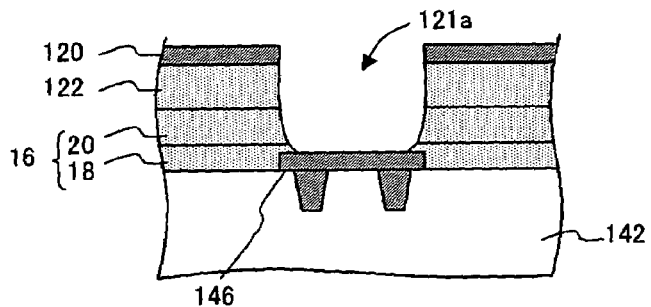

Then the via hole 121a is formed in the resin insulating film 122 and the passivation layer 16 using the conductive film 120 as a mask (FIGS. 2C and 2D). The via hole 121a is formed by forming an opening by a $CO_2$ gas laser and then by fine processing using YAG laser and dry etching.

The $CO_2$ gas laser is emitted in a first condition and then in a second condition in which the pulse width is modified. A laser with a pulse period of 0.25 ms and an output of 1.0 W is used. The first condition may be such that the pulse width is 8-10 μs and the number of shots is 1. The second condition may be such that the pulse width is 3-5 μs, the pulse interval is 25 ms or longer and the number of shots is 3. By radiation, the via hole 121a having a tapered side wall with a progressively smaller diameter toward the semiconductor element 142 and away from the conductive film 120 is formed. The YAG laser condition may be such that the power is 5 W, the pulse width is 10-50 μs, the pulse interval is 10-50 μs and the number of shots is 5-15. With this, fine processing is enabled.

Figure 2E:
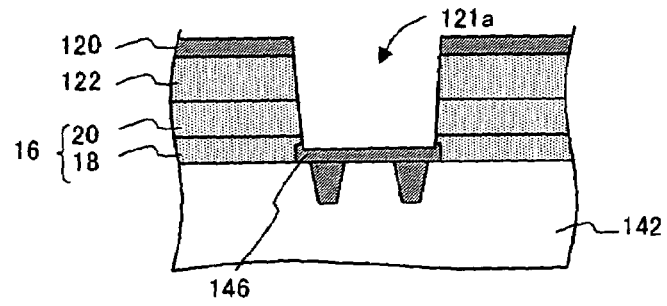

Dry etching using a halogen gas such as chlorine and fluorine is then performed for further fine processing so that the via hole 121a is formed (FIG. 2E). In consequence with this, a portion of the electrode pad 146 is removed so that a recess is formed on the surface of the electrode pad 146. Subsequently, reverse sputtering is performed in an Ar plasma atmosphere.

The reverse sputtering condition may be such that the flow rate of Ar gas is 5 sccm, the pressure is 3 mTorr, the first RF power is 150 W, the second RF power is 280 W and the reverse sputtering is performed at a room temperature. With this, oxides on the surface of the electrode pad 146 are removed.

When the via hole 121a is formed by a $CO_2$ gas laser or a YAG laser, heat is applied to the electrode pad 146 and the surface of the electrode pad 146 may be oxidized. Since the final step of forming the via hole 121a involves dry etching, oxides can be removed. Further, by performing reverse sputtering after the dry etching, oxides are removed more successfully.

Figure 3:
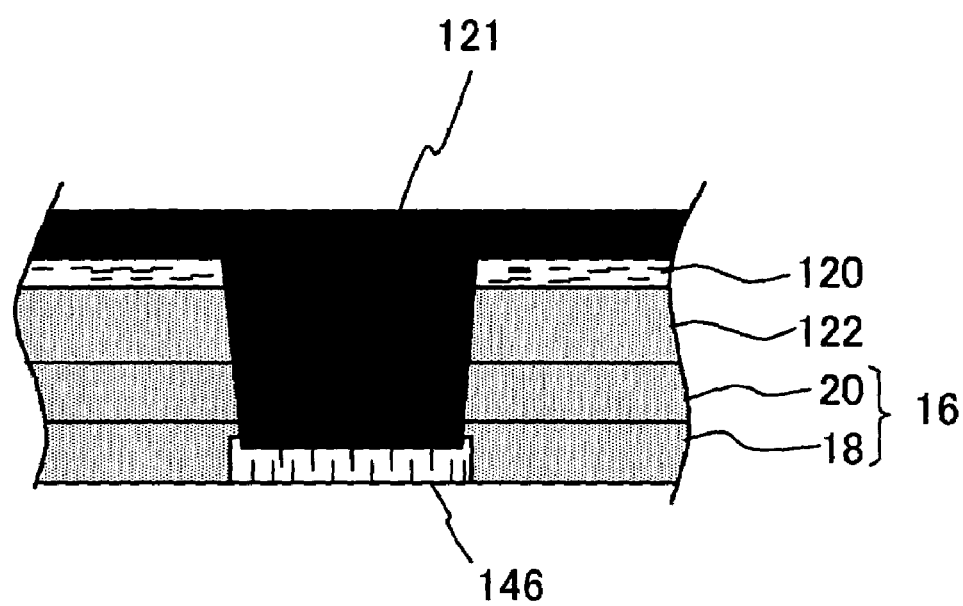
FIG. 3 illustrates a state in which a conductive material is embedded in the via hole formed in a procedure illustrated in FIGS. 2A-2E.

FIG. 3 illustrates a state in which a conductive material is embedded in the via hole 121a thus formed. Since the recess is formed on the surface of the electrode pad 146 by dry etching, the area of contact between the via 121 and the electrode pad 146, occurring when the conductive material is embedded in the via hole 121a to form the via 121, is increased. Accordingly, low resistance of the conductive material is achieved. Further, since oxides are removed by dry etching and reverse sputtering, low resistance of the conductive material is facilitated.

The electrode pad 146 may be formed of copper or Al. The electrode pad 146 is formed of a metal that contains crystal grains with a major axis thereof being aligned with the direction in which the elements are built in the semiconductor apparatus 100.

According to the method of fabricating the semiconductor apparatus 100 described above, the via hole 121a is formed in steps. Therefore, rapid processing and fine processing are achieved. Since the via 121 is formed after removing an oxide film from the surface of the electrode pad 146, low resistance of the via 121 and the electrode pad 146 is achieved. Further, the area of contact between the via 121 and the electrode pad 146 is increased so that low resistance is facilitated. With these merits, it is ensured that the stability of the semiconductor apparatus 100 is favorable.

The semiconductor apparatus described above may be applied to an integrated system in board TM (ISB) package described below. An ISB package is a coreless system in package, a type of electronic circuit packaging mainly comprising bare semiconductor chips, which has a copper wiring pattern but does not use a core (substrate) for supporting circuit components. The patent document No. 2 describes a system in package of this type.

In the related art, an ISB package is produced by forming a stack of a plurality of layers of conductive patterns on a conductive foil that also functions as a supporting substrate, mounting circuit elements in a resultant multilayer wiring structure, molding the structure by an insulating resin, and removing the conductive foil. The conductive foil may have its underside exposed.

According to this package, the following advantages are available.

(i) Since the package is coreless, small-sized and low-profile transistors, ICs and LSIs can be fabricated.

(ii) Since transistors, system LSIs, and capacitors and resistors of a chip type can be built into the circuit for packaging, a highly advanced system in package (SIP) is achieved.

(iii) By employing a combination of currently available semiconductor chips, a system LSI can be developed in a short period of time.

(iv) Since there is no core material underneath the bare semiconductor chips, resultant heat dissipation is favorable.

(v) Since the circuit wiring is made of copper and not supported by any core material, a low-dielectric circuit wiring, exhibiting excellent characteristics in high-speed data transfer and high-frequency circuits, results.

(vi) Since electrodes are embedded inside the package, creation of particle contaminants derived from an electrode material is controlled.

(vii) The package size is free. Since the volume of discarded materials per one package is approximately 1/10 of a 64-pin SQFP package, the load placed on the environment is reduced.

(viii) A new system configuration, embodying a concept shift from a printed circuit board carrying components to a circuit board with built-in functions, is realized.

(ix) Designing an ISB pattern is as easy as pattern design of a printed circuit board so that engineers of a set manufacturer can design the pattern on their own.

Described above is an explanation of the present invention based on the embodiment and the example. The embodiment and the example are only illustrative in nature and it will be obvious to those skilled in the art that variations are possible within the scope of the present invention.

What is claimed is:

1. A method of fabricating a semiconductor apparatus, comprising:

forming a via hole in a resin insulating film formed on a circuit element provided with electrode pads so as to expose said electrode pads; and introducing a conductive material in said via hole for connection with said electrode pads, wherein the forming of said via hole includes forming an opening in said resin insulating film by applying laser radiation to the resin insulating film, and subsequently dry etching and forming a recess in said electrode pads, wherein applying the laser radiation comprises applying a first laser to the resin insulating film and subsequently applying a second laser to the resin insulating film characterized by a speed in processing the insulating resin film slower than that of the first laser.

2. The method of fabricating a semiconductor apparatus according to claim 1, wherein said semiconductor apparatus further includes a conductive film formed on said resin insulating film, and the forming of said via hole includes removing a portion of said conductive film and using said conductive film as a mask.

3. The method of fabricating a semiconductor apparatus according to claim 1, wherein forming an opening in said resin insulating film comprises applying a $CO_2$ gas laser to the resin insulating film and applying a YAG laser to the insulating film.

4. The method of fabricating a semiconductor apparatus according to claim 2, wherein forming an opening in said resin insulating film comprises applying a $CO_2$ gas laser to the resin insulating film and applying a YAG laser to the resin insulating film.

5. The method of fabricating a semiconductor apparatus according to claim 1, wherein the forming of said via hole includes performing reverse sputtering in a plasma environment.

6. The method of fabricating a semiconductor apparatus according to claim 2, wherein the forming of said via hole includes performing reverse sputtering in a plasma environment.

7. The method of fabricating a semiconductor apparatus according to claim 3, wherein the forming of said via hole includes performing reverse sputtering in a plasma environment.

8. The method of fabricating a semiconductor apparatus according to claim 4, wherein the forming of said via hole includes performing reverse sputtering in a plasma environment.

9. The method of fabricating a semiconductor apparatus according to claim 1 wherein the recess is formed by dry etching.

* * * * *